US012803263B2

(12) United States Patent
Bhooshan et al.

(10) Patent No.: US 12,803,263 B2
(45) Date of Patent: Nov. 17, 2026

(54) CIRCUIT FOR DETECTION AND MITIGATION OF DEVICE DAMAGE TO AN ELECTRONIC DEVICE

(71) Applicant: NXP B.V., Eindhoven (NL)

(72) Inventors: Rishi Bhooshan, Greater Noida (IN); Vigyan Jain, Rewari (IN); Shilpa Gupta, Rohini (IN); Chandan Gupta, Greater Noida (IN); Douglas Michael Reber, Austin, TX (US)

(73) Assignee: NXP B.V., Eindhoven (NL)

( * ) Notice: Subject to any disclaimer, the term of this patent is extended or adjusted under 35 U.S.C. 154(b) by 340 days.

(21) Appl. No.: 18/441,013

(22) Filed: Feb. 14, 2024

(65) Prior Publication Data

US 2025/0210958 A1 Jun. 26, 2025

(30) Foreign Application Priority Data

Dec. 26, 2023 (IN) ............................ 202341088819

(51) Int. Cl.
*H02H 1/00* (2006.01)
*G01R 31/317* (2006.01)
*H02H 9/04* (2006.01)
*H03K 17/081* (2006.01)

(52) U.S. Cl.
CPC ..... *H02H 1/0007* (2013.01); *G01R 31/31703* (2013.01); *H02H 9/041* (2013.01); *H03K 17/08104* (2013.01)

(58) Field of Classification Search
CPC ................ H02H 1/0007; H02H 9/041; G01R 31/31703; H03K 17/08104; H10D 89/611; H10D 89/811
USPC ........................................................... 361/56
See application file for complete search history.

(56) References Cited

U.S. PATENT DOCUMENTS 5,416,351 A * 5/1995 Ito ............................ G05F 3/30 257/357
5,650,745 A 7/1997 Merrill et al.
6,075,686 A * 6/2000 Ker ..................... H10D 89/601 361/56

(Continued)

OTHER PUBLICATIONS

Chu, et al., "New RC-Imbalance Failure Mechanism of WELL Charging Damage and The Implemented Rule", 2022 IEEE International Reliability Physics Symposium (IRPS), pp. 1-4, 2022.

*Primary Examiner* — Dharti H Patel

(57) ABSTRACT

A system and method for electronic device damage detection is presented. A first input signal is supplied to an input terminal of an electronic device. The electronic device includes a input terminal, a first electronic circuit including a first transistor, wherein a control terminal of the first transistor is electrically connected to the input terminal, a second electronic circuit including a clamp diode transistor, wherein the clamp diode is electrically connected to the input terminal, wherein the clamp diode transistor is configured to receive a control input signal and when the control input signal has a first value the clamp diode transistor is conductive, and an output terminal electrically connected to the first electronic circuit and the second electronic circuit. The control input signal is switched between the first value and a second value and an output of the electronic device is monitored to detect a malfunction.

20 Claims, 9 Drawing Sheets

(56) References Cited

U.S. PATENT DOCUMENTS

| | | | | |
|---|---|---|---|---|
| 6,078,487 | A * | 6/2000 | Partovi | H03K 17/08142 361/111 |
| 6,218,706 | B1 * | 4/2001 | Waggoner | H10D 89/601 257/355 |
| 6,297,984 | B1 | 10/2001 | Roizin | |
| 6,414,358 | B1 | 7/2002 | Lin et al. | |
| 6,417,544 | B1 * | 7/2002 | Jun | H10D 89/611 438/237 |
| 8,116,046 | B2 * | 2/2012 | Block | H04B 1/18 361/119 |
| 8,634,174 | B2 * | 1/2014 | Abou-Khalil | H02H 9/046 361/111 |
| 9,466,976 | B2 * | 10/2016 | Gray | H02H 9/042 |
| 10,593,661 | B2 * | 3/2020 | Taft | H10D 89/611 |
| 10,788,525 | B2 | 9/2020 | Hiura et al. | |
| 10,825,806 | B2 | 11/2020 | Hiblot et al. | |
| 2002/0130368 | A1 * | 9/2002 | Tan | H10D 89/811 257/369 |
| 2008/0175045 | A1 * | 7/2008 | Lin | G11C 11/413 365/182 |
| 2011/0198678 | A1 * | 8/2011 | Ker | H02H 9/046 257/296 |
| 2012/0019231 | A1 * | 1/2012 | Chen | H02M 3/158 323/312 |
| 2012/0300349 | A1 * | 11/2012 | Abou-Khalil | H02H 9/046 716/102 |
| 2013/0256801 | A1 * | 10/2013 | Yen | H10D 8/01 257/357 |
| 2014/0268446 | A1 * | 9/2014 | Gudem | H02H 9/041 361/56 |
| 2014/0376134 | A1 * | 12/2014 | Hunter | H02H 9/044 361/88 |
| 2020/0350875 | A1 * | 11/2020 | Parthasarathy | H03F 1/0211 |
| 2021/0044104 | A1 * | 2/2021 | Domanski | H02H 9/02 |
| 2022/0293597 | A1 | 9/2022 | Hu et al. | |
| 2023/0086010 | A1 | 3/2023 | Gonzalez et al. | |
| 2023/0187435 | A1 * | 6/2023 | Tseng | H02H 9/02 361/86 |
| 2025/0210958 | A1 * | 6/2025 | Bhooshan | H03K 17/08104 |

* cited by examiner

CIRCUIT FOR DETECTION AND MITIGATION OF DEVICE DAMAGE TO AN ELECTRONIC DEVICE

CROSS-REFERENCE TO RELATED APPLICATIONS

This application claims the priority under 35 U.S.C. § 119 of India patent application No. 202341088819, filed on 26 Dec. 2023, the contents of which are incorporated by reference herein.

TECHNICAL FIELD

This disclosure relates generally to circuit structures and methods for detecting and mitigating damage that may occur to an electronic device during device fabrication and, specifically, damage that may occur due to electrical discharge resulting from plasma-induced charges in a device's electrical structures.

BACKGROUND

Semiconductor devices can be fabricated on insulative substrates. During device fabrication, such substrates sometimes accumulate charge in the substrate itself and in the devices formed or being formed on or in the substrate. If sufficient charge is accumulated, the charge is suddenly dissipated, potentially resulting in damage to the devices being fabricated on the substrate.

System-on-chip (SOC) devices are often fabricated by forming a large number of isolated well structures (e.g., positive-well or PWELL structures) within the substrate. Those isolated well structures are often formed within larger well structures that are formed using opposite doping chemistry. Various SOC components can be formed within the isolated well structures, which provide improved isolation to reduce substrate noise coupling in the case of analog circuits.

In an SOC device, the isolated well structures are connected to power or ground metal distributed networks. During device fabrication, these power and ground distribution networks operate as metal antennas that collect the charges during plasma processing steps (e.g., during plasma etching). In SOC devices in which there are driver/receiver pairs placed in different isolated wells structures, but that are electrically connected to one another, a discharge path from the driver located in one isolated WELL to a receiver located in another isolated WELL is established. In such a configuration, WELL charging that occurs during plasma processing may cause a voltage difference across the gate oxide of the receiver, which can lead to gate oxide failure if the accumulated charge resulting into voltage difference exceeding the gate oxide breakdown voltage. Even if this does not cause device failure during fabrication, however, this weakens the gate oxide which may fail later in the field.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following sets forth a detailed description of various embodiments intended to be illustrative of the invention and should not be taken to be limiting.

Semiconductor devices find application in a wide variety of electronic components and systems. In some applications, devices, such as system-on-chip (SOC) devices, device components are formed within isolated WELLs within the device substrate. In some device configurations, such devices may include drivers or receiver devices configured to process wireless (e.g., radio frequency) signal transmissions. These devices are often connected to antenna structures that are also formed over the device substrate to facilitate the transmission and reception of such wireless signals.

Figure 1:
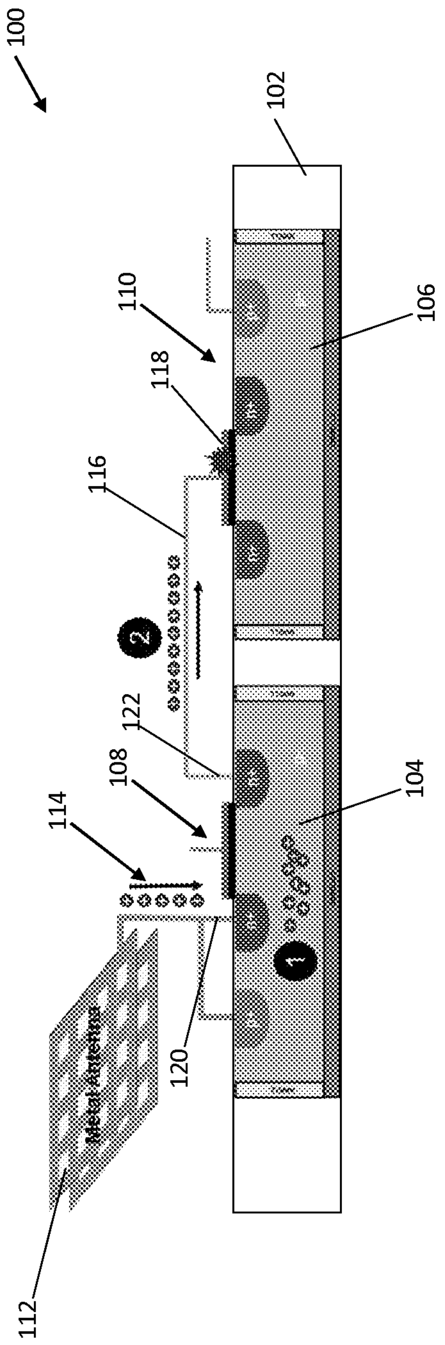
FIG. 1 PRIOR ART
FIG. 1 is a cross-sectional view of a conventional layout of isolated wells in a system-on-chip (SOC) device showing a well charging phenomenon that can cause gate-oxide damage.

During device fabrication, techniques such as plasma etching and/or plasma deposition may be used to form particular structures over the device substrate. These processes, however, involve the generation of positive and negative ions, ionized gases, and electrons, which can all result on electrical charge accumulating on those antenna structures. To illustrate, FIG. 1 is a cross-sectional view of an SOC device 100. Device 100 includes a substrate 102 including isolated WELLs 104, 106. In this example, isolated WELL 104 includes a driver circuit that includes a transistor 108. Isolated WELL 106 includes a receiver circuit that includes transistor 110. As illustrated, an input terminal 120 of transistor 108 of isolated WELLs 104 is connected to antenna 112. An output terminal 122 of transistor 108 is connected, via electrical connection 116, to a gate terminal 118 of transistor 110 of isolated WELLs 106.

During device fabrication, and particularly during plasma processing, electrical charge can accumulate within antenna 112. That charge also accumulates (as depicted by arrow 114) at a first terminal (e.g., a source or drain terminal) of transistor 108. When the charge has accumulated to a sufficient degree, the charge is discharged through connection 116 into the gate terminal 118 of transistor 110.

The electrical discharge into gate terminal 118 can cause damage to transistor 110 and, specifically, the gate oxide material making up gate terminal 118 of transistor 110. This damage may cause transistor 110 to fail entirely (such that transistor 110 is never operational) or may cause sufficient damage the transistor 110 fails at a later date after fabrication of SOC device 100 is complete and the device has been operational in the field.

To mitigate these problems associated with plasma-processing charge build-up and discharge, the present disclosure proposes a circuit implementation configured to prevent, detect and correct the plasma-induced damage of SOC device gate oxide due to antenna-induced isolated WELL charging and device failure in the field due to aging.

As described herein, the present circuit approach is configured to detect plasma-induced damage (PID) via a self-test algorithm (see, for example, the method of FIG. 11, described below). If a failure is detected (indicating some damage to device gate oxides), the present circuit may be utilized to remove the damaged device from the SOC device circuit to provide ongoing operations of the SOC, even if at reduced clock speeds.

Figure 2:
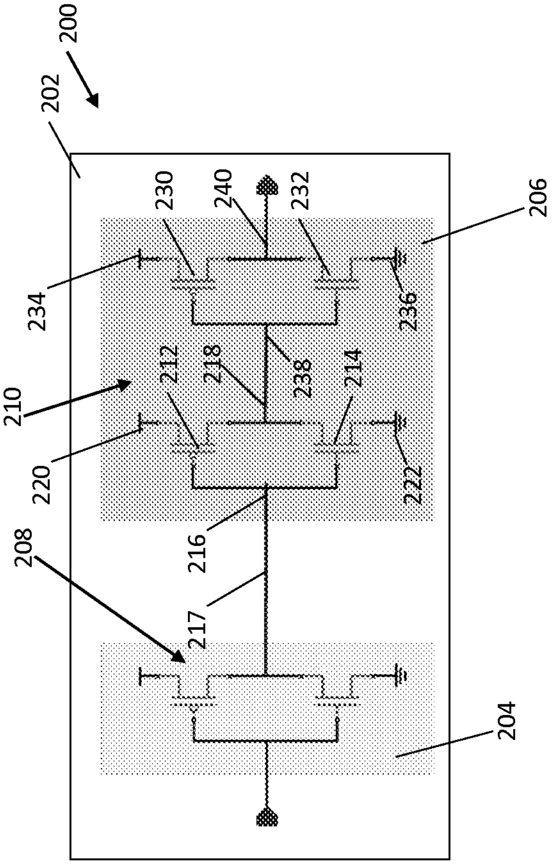
FIG. 2 PRIOR ART
FIG. 2 is a simplified depiction of a conventional SOC device configured to implement a buffer circuit.

To illustrate, FIG. 2 is a simplified depiction of a conventional SOC device 200 configured to implement a buffer circuit. Conventional SOC device 200 includes a substrate 202 including isolated WELL 204 and isolated WELL 206. Device 208 is formed within isolated WELL 204. Device 208 includes an electronic circuit (e.g., a transistor in combination with an antenna or antenna-like structure) that is susceptible to charge build-up during a plasma-based manufacturing process of conventional SOC device 200. A buffer 210 is formed within isolated WELL 206. Buffer 210 includes a transistor pair including transistor 212 and 214 connected between a power supply terminal and a ground terminal. Transistors 212 and 214 are connected in an inverter configuration with an input terminal 216 and an output terminal 218. Input terminal 216 is connected to device 208 via electrical connection 217 and to the gate terminals of transistors 212 and 214. The gate terminal of transistor 212 is inverting, so that transistor 212 is conductive when the value at input terminal 216 is a low value. Conversely, the gate terminal of transistor 214 is non-inverting so that transistor 214 so that transistor 214 is conductive when the value at input terminal 216 is high. Accordingly, the value at output terminal 218 is equal to a high value (i.e., the level of power terminal 220) when the value at input terminal 216 is a low value. Conversely, the value at output terminal is equal to a low value (i.e., the level of ground terminal 222) when the value at input terminal 216 is a high value. As such, transistors 212 and 214 work in combination to invert the value at input terminal 216.

As second pair of transistors 230 and 232 are similarly configured in an inverter configuration between power terminal 234 and ground terminal 236. The inverter formed by transistors 230 and 232 has an input terminal 238 that is electrically connected to output terminal 218 of the inverter formed by transistors 212 and 214 and an output terminal 240.

The two inverters formed by the first pair of transistors 212 and 214 and the second pair of transistors 230 and 232 forms a buffer in which the input value to buffer 210 received at input terminal 216 is replicated at output terminal 240.

In this configuration, during fabrication of conventional SOC device 200 and, specifically, during fabrication processes that involve plasma-based operations (e.g., plasma etching and/or plasma deposition) there is a risk of electrical charge build-up within isolated WELL 204 and device 208. That electrical charge may be discharged through 217 into buffer 210, resulting in potential damage to buffer 210. In a typical case, this electrical discharge may be likely to damage the gate oxide of the gate terminal of transistor 214, which we be subjected to a majority of that electrical discharge.

Figure 3:
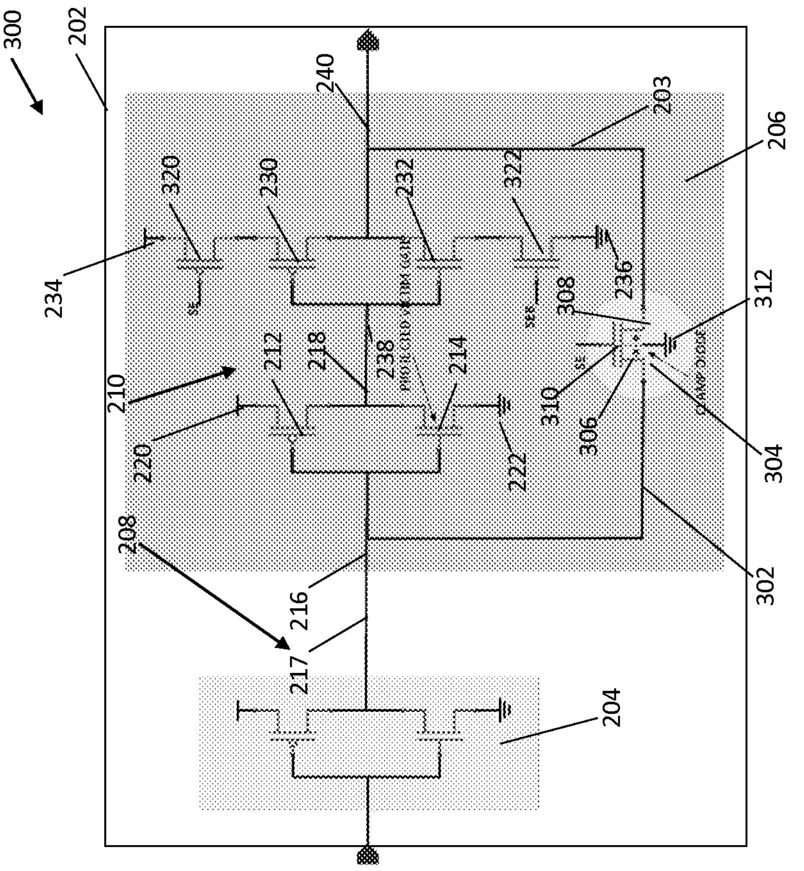
FIG. 3 depicts the conventional SOC device of FIG. 2 modified by the incorporation of additional circuit elements to form an SOC device configured to provide electrical discharge protection.

To remedy these problems, FIG. 3 depicts a modified buffer circuit configuration in which additional circuit components are incorporated to protect the buffer circuit from damage due to electrical discharge occurring during device fabrication. FIG. 3 depicts the conventional SOC device 200 of FIG. 2 modified by the incorporation of additional circuit elements to form a new SOC device 300 provide electrical discharge protection. To the extent components in SOC device 300 are the same as those depicted in FIG. 2 (i.e., configured in the same manner and providing the same functionality), component element numbers are unchanged and the pertinent description of such components above is applicable.

As depicted, SOC device 300 includes a bypass path 302 that is connected between input terminal 216 of buffer 210 and output terminal 240. Bypass path 302 includes a pass transistor 304. A first terminal 306 (e.g., a source terminal) of pass transistor 304 is connected via path 203 to input terminal 216. A second terminal 308 (e.g., a drain terminal) of pass transistor 304 is connected via path 203 to output terminal 240. A control terminal 310 (e.g., a gate terminal) of pass transistor 304 receives a selection input signal SE, which determine whether pass transistor 304 is operational.

Pass transistor 304 is formed within isolated WELL 206 and has a clamp diode configuration in which a pair of diodes are connected between a ground terminal and the first terminal 306 and second terminal 308 of pass transistor 304. The clamp diodes are configured to limit a voltage that can be applied across pass transistor 304. If that voltage is exceeded, the pass transistor 304 is effectively shorted to ground, thereby protecting the transistor 304.

Although this clamp diode configuration can be useful in limiting the voltage that can be applied across pass transistor 304 (e.g., due to electrical discharge from isolated WELL 204), the clamp diode configuration is generally helps to provide discharge path within the transistors of an active device within isolated WELL 206 (e.g., transistors 212, 214)

During device fabrication, pass transistor 304 operates to protect transistors 212, 214, from electrical discharge from isolated WELL 204 and into input terminal 216 that may occur during fabrication steps involving plasma operations. This results because if the electrical discharge reaches a significant value (e.g., one that may cause damage to any of transistors 212, 214), the clamp diode configuration of pass transistor 304 causes that electrical discharge to be passed to ground (e.g., via ground terminal 312).

If, however, that electrical discharge does cause damage to one or more of transistors 212, 214 that may affect their operation, that damage can be detected using the present SOC device 300.

Specifically, SOC device 300 includes a pair of transistors 320, 322 that have been added at the output stage of buffer 210. Specifically, transistor 320 is connected between power terminal 234 and transistors 230. The control terminal of transistor 320 receives an input signal SE. Transistor 322 is connected between ground terminal 236 and transistors 232. The control terminal of transistor 322 receive an input signal SEB, which is the opposite of SE.

In this configuration, if the value of SE is high (indicating that pass transistor 304 is operational), the output stage of buffer 210 is disabled-transistor 320 is turned off (due to the inversion at the control terminal of transistor 320) and, similarly, transistor 322 is turned off (due to the inverted control signal SEB being supplied at the control terminal).

As such, with SE set to a high value, buffer 210 is disabled and transistor 304 is enabled cause the input signal received at input terminal 216 to be supplied at output terminal 240.

Given this structure, therefore it is possible to test the operation of buffer 210. By supplying a particular input and toggling the control signal SE it is possible to selectively enable and disable the operation of buffer 210 and, correspondingly, transistor 304. Because the output of buffer 210 should match its input and because pass transistor 304 is configured to simply supply the input signal at input terminal 216 to output terminal 240, when toggling the value of SE, the output at output terminal 240 should not change if buffer 210 is operating correctly (i.e., has not been damaged). Accordingly, using the circuit of SOC device 300 not only does pass transistor 304 provide significant protection against electrical discharge, but by toggling the value of control signal SE and monitoring the output of buffer 210 it is possible to detect that buffer 210 is not operating correctly (e.g., as a buffer), which can be indicate of damage, which may be due to electrical discharge, for example, into the gate terminal of one or more of transistors 212, 214.

In the event that damage is detected, the control signal, SE, may be set to a high value, in which buffer 210 is disabled and instead, pass transistor 304 operates as a buffer. Although this may enable ongoing error-free operations of SOC device 300, as mentioned above the configuration of pass transistor 304 may not enable operation of SOC device 300 at full clock-speeds. Accordingly, when bypassing buffer 210 the operational frequency of SOC device 300 may be reduced.

Figure 4:
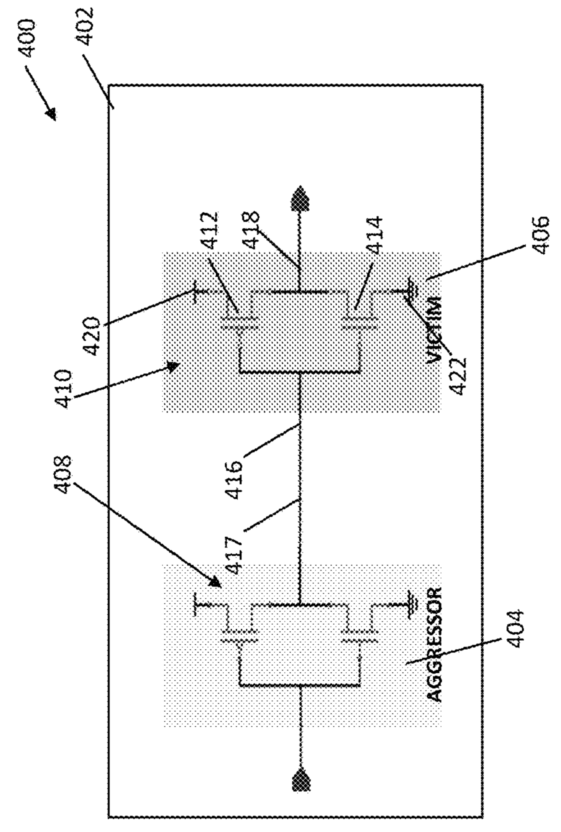
FIG. 4 is a simplified depiction of a conventional SOC device configured to implement an inverter.

In another embodiment, the present disclosure provides a circuit for detection and mitigation of PID-induced failure in an inverter device. To illustrate, FIG. 4 is a simplified depiction of a conventional SOC device 400 configured to implement an inverter. SOC device 400 includes a substrate 402 including isolated WELL 404 and isolated WELL 406. Device 408 is formed within isolated WELL 404. Device 408 includes an electronic circuit (e.g., a transistor in combination with an antenna or antenna-like structure) that is susceptible to charge build-up during a plasma-based manufacturing process of SOC device 400. Inverter 410 is formed within isolated WELL 406. Inverter 410 includes a transistor pair including transistor 412 and 414 connected between a power supply terminal 420 and ground terminal 422. Transistors 412 and 414 are connected in an inverter configuration with an input terminal 416 and an output terminal 418. Input terminal 416 is connected to device 408 via electrical connection 417 and to the gate terminals of transistors 412 and 414. The gate terminal of transistor 412 is inverting, so that transistor 412 is conductive when the value at input terminal 416 is a low value. Conversely, the gate terminal of transistor 414 is non-inverting so that transistor 414 is conductive when the value at input terminal 416 is high. Accordingly, the value at output terminal 418 is equal to a high value (i.e., the level of power terminal 420) when the value at input terminal 416 is a low value. Conversely, the value at output terminal is equal to a low value (i.e., the level of ground terminal 422) when the value at input terminal 416 is a high value. As such, transistors 412 and 414 work in combination to invert the value at input terminal 416.

In this configuration, during fabrication of SOC device 400 and, specifically, during fabrication processes that involve plasma-based operations (e.g., plasma etching and/or plasma deposition) there is a risk of electrical charge build-up within isolated WELL 404. That electrical charge may be discharged through connection 417 into the gates of the inverter 410, resulting in potential damage to inverter 410. In a typical case, this electrical discharge may be likely to damage the gate oxide of the gate terminal of transistor 414, which will be subjected to a majority of that electrical discharge.

Figure 5:
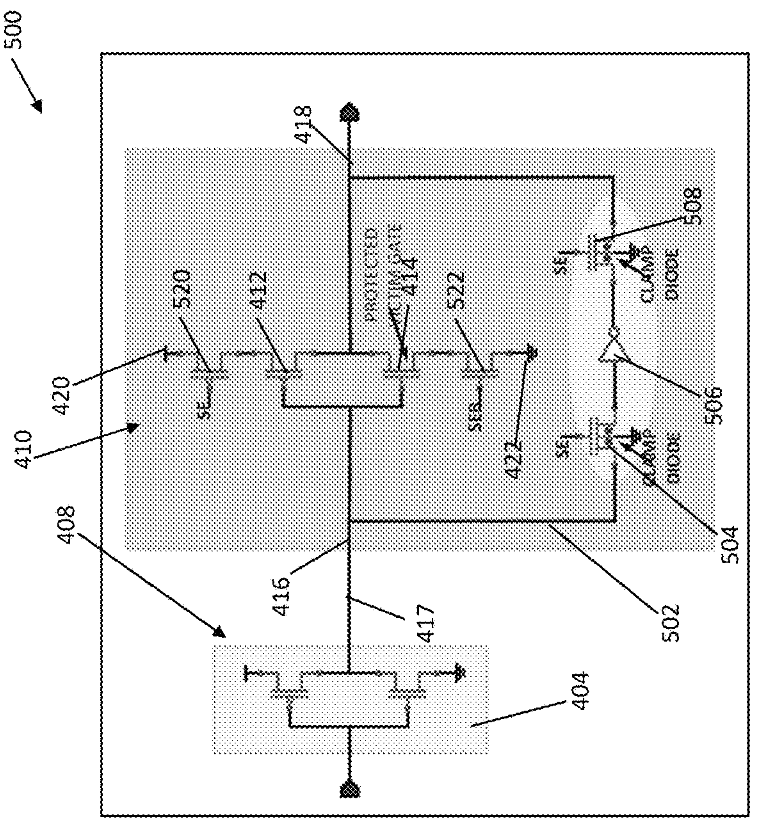
FIG. 5 depicts the SOC device of FIG. 4 modified by the incorporation of additional circuit elements to form an SOC device configured to provide electrical discharge protection.

To remedy these problems, FIG. 5 depicts a modified inverter circuit configuration in which additional circuit components are incorporated to protect the inverter circuit from damage due to electrical discharge occurring during device fabrication. FIG. 5 depicts the SOC device 400 of FIG. 4 modified by the incorporation of additional circuit elements to form SOC device 500 configured to provide electrical discharge protection. To the extent components in SOC device 500 are the same as those depicted in FIG. 4 (i.e., configured in the same manner and providing the same functionality), component element numbers are unchanged and the pertinent description of such components above is applicable.

As depicted, SOC device 500 includes a bypass path 502 that is connected between input terminal 416 of inverter 410 and output terminal 418. Bypass path 502 includes pass transistor 504. An input terminal of transistor 504 is connected to input terminal 416. Bypass path 502 includes inverter 506. An input terminal of inverter 506 is connected to an output terminal of transistor 504. Bypass path 502 includes pass transistor 508. An input terminal of pass transistor 508 is connected to an output terminal of inverter 506. An output terminal of pass transistor 508 is connected to output terminal 418.

The control terminals of pass transistors 504 and 508 receive a selection input signal SE, which determine whether pass transistors 504 and 508 are conductive.

Pass transistor 504 is formed within isolated WELL 406 and has a clamp diode configuration in which a pair of parasitic diodes are connected between a ground terminal and the input and output terminals of pass transistor 504. The parasitic clamp diodes are helpful to limit the positive charge buildup at its cathode, as an accumulation of this charge could result in an excessive voltage at this location. Should this voltage surpass the breakdown threshold of the parasitic clamp diode, it causes the diode to essentially create a direct path to ground. This action safeguards transistor 414 by preventing excess voltage from damaging it.

Pass transistor 508 is formed within isolated WELL 406 and has a clamp diode configuration in which a pair of diodes are connected between a ground terminal and the input and output terminals of pass transistor 508. During device fabrication, pass transistor 504 operates to protect transistors 412 and 414 from electrical discharge from isolated WELL 404 and into input terminal 416 that may occur during fabrication steps involving plasma operations. This results because if the electrical discharge reaches a significant value (e.g., one that may cause damage to any of transistors 412 and 414), the clamp diode configuration of pass transistors 504 can cause that electrical discharge to be passed to ground.

If, however, that electrical discharge does cause damage to one or more of transistors 412 and 414 that may affect their operation, that damage can be detected using the present SOC device 500 configuration.

Specifically, SOC device 500 includes a pair of transistors 520, 522 that have been incorporated into inverter 410. Transistor 520 is connected between power terminal 420 and transistor 412. The control terminal of transistor 520 receives an input signal SE. Transistor 522 is connected between ground terminal 422 and transistor 414. The control terminal of transistor 522 receive an input signal SEB, which is the opposite of SE.

In this configuration, if the value of SE is high (indicating that pass transistors 504 and 508 are operational), inverter 410 is disabled-transistor 520 is turned off (due to the inversion at the control terminal of transistor 520) and, similarly, transistor 522 is turned off (due to the inverted control signal SEB being supplied at the control terminal). As such, with SE set to a high value, inverter 410 is disabled and transistors 504 and 508 are enabled. In this configuration, the signal received at input terminal 416 passes through pass transistor 504, is inverted by inverter 506, passes through pass transistor 508 and is output at output terminal 418. In other words, when SE is set to a high level inverter 410 is disabled and bypass path 502 is enabled. Because bypass path 502 includes inverter 506, bypass path 502 operates as an inverter to mimic the functionality of inverter 410.

Given this structure, therefore it is possible to test the operation of inverter 410. By supplying a particular input and toggling the control signal SE it is possible to selectively enable and disable the operation of inverter 410 and, correspondingly, transistors 504 and 508. Because the output of inverter 410 should be the opposite of its input and because pass transistors 504 and 508 in combination of inverter 506 operate to output at output terminal 418 the inverted value of the input signal received from input terminal 416, when toggling the value of SE, the output at output terminal 418 should not change if inverter 410 is operating correctly (i.e., has not been damaged). Accordingly, using the circuit of SOC device 500 not only do pass transistors 504 and 508 provide protection against electrical discharge, but by toggling the value of control signal SE and monitoring the signal at output terminal 418 it is possible to detect that inverter 410 is not operating correctly (e.g., as an inverter), which can be an indication of damage, which may be due to electrical discharge, for example, into the gate terminal of one or more of transistors 412 and 414.

In the event that damage is detected, the control signal may be set to a high value, in which case inverter 410 is disabled and instead, pass transistors 504 and 508 and inverter 506 operate as an inverter. Although this may enable ongoing error-free operations of SOC device 500, as mentioned above, the configuration of pass transistors 508 and 508 may not enable operation of SOC device 500 at full clock-speeds. Accordingly, when bypassing inverter 410 the operational frequency of SOC device 500 may be reduced.

Figure 6:
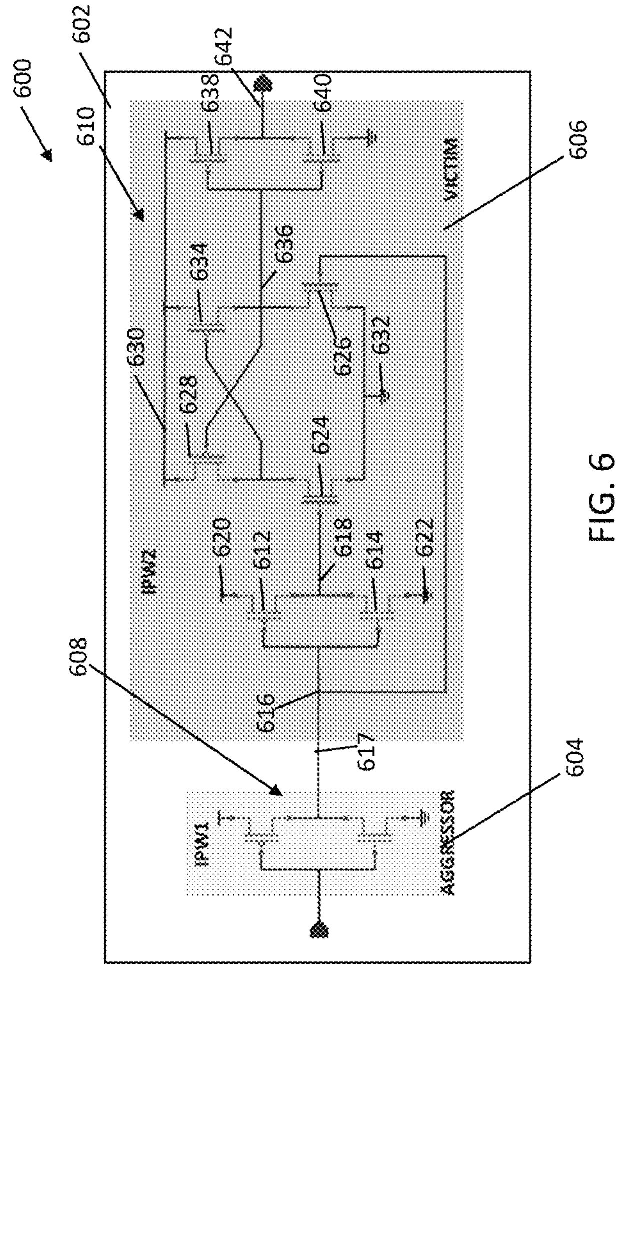
FIG. 6 is a simplified depiction of a conventional SOC device configured to implement a level shifter.

In another embodiment, the present disclosure provides a circuit for detection and mitigation of PID-induced failure in a level shifter device. To illustrate, FIG. 6 is a simplified depiction of a conventional SOC device 600 configured to implement a level shifter. SOC device 600 includes a substrate 602 including isolated WELL 604 and isolated WELL 606. Device 608 is formed within isolated WELL 604. Device 608 includes an electronic circuit (e.g., a transistor in combination with an antenna or antenna-like structure) that is susceptible to charge build-up during a plasma-based manufacturing process of SOC device 600. Level shifter 610 is formed within isolated WELL 606. Level shifter 610 includes a transistor pair including transistor 612 and 614 connected between a power supply terminal 620 and ground terminal 622. Transistors 612 and 614 are connected in an inverter configuration with an input terminal 616 and an output terminal 618. Input terminal 616 is connected to device 608 via electrical connection 617 and to the gate terminals of transistors 612 and 614. The value at output terminal 618 is equal to a high value when the value at input terminal 616 is a low value. Conversely, the value at output terminal 618 is equal to a low value when the value at input terminal 616 is a high value. As such, transistors 612 and 614 work in combination to invert the value at input terminal 616.

Input terminal 616 and output terminal 618 are connected, respectively, to the gate or control terminals of transistors 624 and 626. Transistor 624 is connected in series to transistor 628 between power terminal 630 and ground terminal 632. Transistor 626 is connected in series to transistor 634 between power terminal 630 and ground terminal 632.

In the configuration shown in FIG. 6, the combination of transistors 624, 628, 626, and 634 are configured as a level shifter such that they operate to take an input signal (e.g., received via output terminal 618), modify the level of that input signal by shifting the entire input signal by a fixed voltage amount, which is determined by the magnitude of the voltage at power terminal 630 and the relative sizes of transistors 624, 628, 626, and 634, as is known in the art, and output the level-shifted output signal at output 636.

That output signal is then inverted by the inverter formed by transistors 638 and 640 (to offset the signal inversion performed by the inverted formed by transistors 612 and 614 and also to isolate the core level shifting circuit formed by 624, 626, 628, and 634 from the load at 642.) and the non-inverted level-shifted signal is ultimately output at output node 642.

In this configuration, during fabrication of SOC device 600 and, specifically, during fabrication processes that involve plasma-based operations (e.g., plasma etching and/or plasma deposition) there is a risk of electrical charge build-up within isolated WELL 604 and device 608. That electrical charge may be discharged through connection 617 into level shifter 610, resulting in potential damage to level shifter 610. In a typical case, this electrical discharge may be likely to damage the gate oxide of the gate terminal of transistor 614, which we be subjected to a majority of that electrical discharge.

Figure 7:
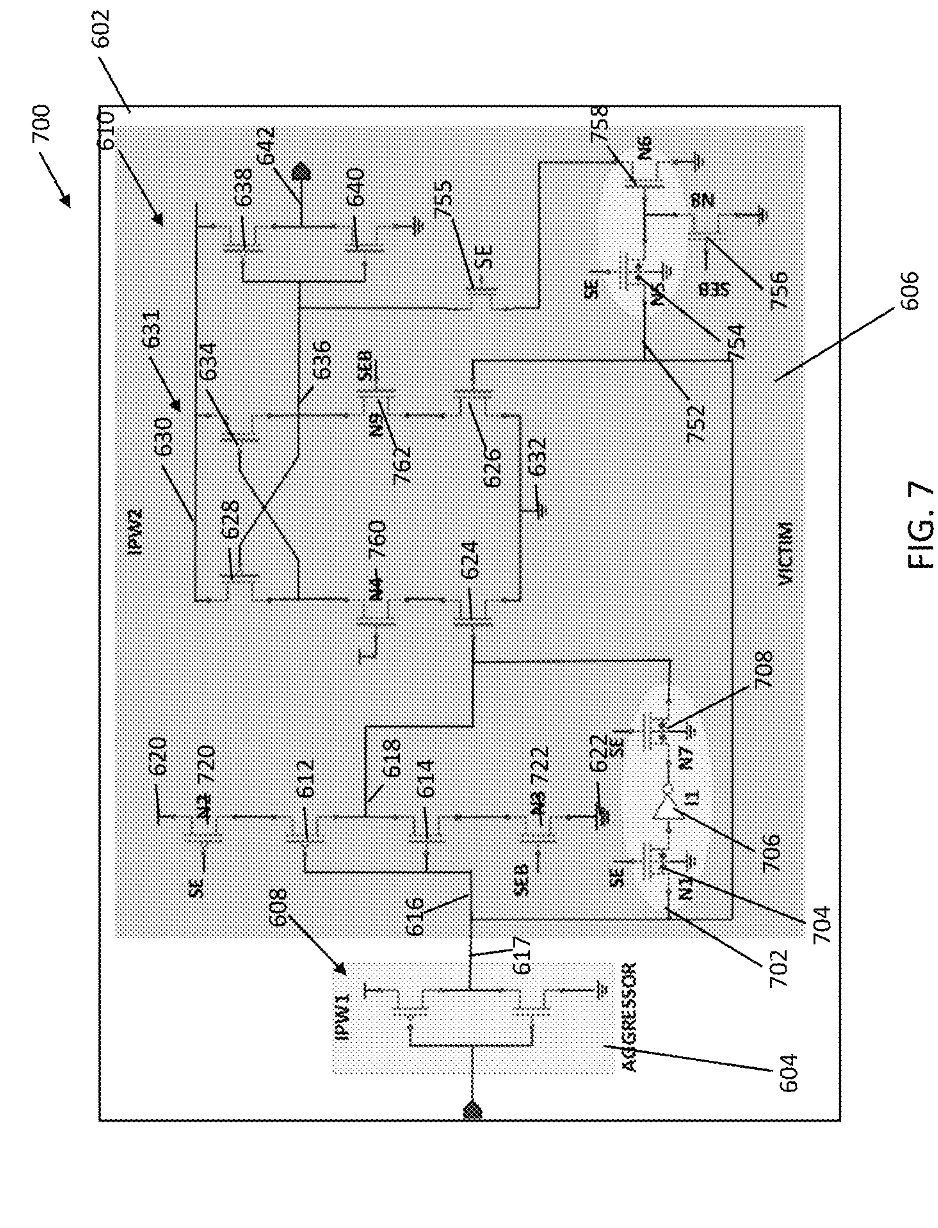
FIG. 7 depicts the SOC device of FIG. 6 modified by the incorporation of additional circuit elements to form an SOC device configured to provide electrical discharge protection.

To remedy these problems, FIG. 7 depicts a modified level shifter circuit configuration in which additional circuit components are incorporated to protect the level shifter circuit from damage due to electrical discharge occurring during device fabrication. FIG. 7 depicts the SOC device 600 of FIG. 6 modified by the incorporation of additional circuit elements to form SOC device 700 configured to provide electrical discharge protection. To the extent components in SOC device 700 are the same as those depicted in FIG. 6 (i.e., configured in the same manner and providing the same functionality), component element numbers are unchanged and the pertinent description of such components above is applicable.

As depicted, SOC device 700 includes a bypass path 702 that is connected between input terminal 616 of the inverter formed by transistors 612 and 614 and output terminal 618. Bypass path 702 includes pass transistor 704. An input terminal of transistor 704 is connected to input terminal 616. Bypass path 702 includes inverter 706. An input terminal of inverter 706 is connected to an output terminal of transistor 704. Bypass path 702 includes pass transistor 708. An input terminal of pass transistor 708 is connected to an output terminal of inverter 706. An output terminal of pass transistor 708 is connected to output terminal 618.

The control terminals of pass transistors 704 and 708 receive a selection input signal SE, which determine whether pass transistors 704 and 708 are conductive.

During device fabrication, pass transistor 704 operate to protect transistors 612 and 614 from electrical discharge from isolated WELL 604 and into input terminal 616 that may occur during fabrication steps involving plasma operations. This results because if the electrical discharge reaches a significant value (e.g., one that may cause damage to any of transistors 612 and 614), the clamp diode configuration of pass transistors 704 can cause that electrical discharge to be passed to ground. If, however, that electrical discharge does cause damage to one or more of transistors 612 and 614 that may affect their operation, that damage can be detected using the present SOC device 700 configuration.

Specifically, SOC device 700 includes a pair of transistors 720, 722 that have been incorporated into the inverter made up of transistors 612 and 614. Transistor 720 is connected between power terminal 620 and transistor 612. The control terminal of transistor 720 receives an input signal SE. Transistor 722 is connected between ground terminal 622 and transistor 614. The control terminal of transistor 722 receive an input signal SEB, which is the opposite of SE.

In this configuration, if the value of SE is high (indicating that pass transistors 704 and 708 are operational), the inverter made up of transistors 612 and 614 is disabled-transistor 720 is turned off (due to the inversion at the control terminal of transistor 720) and, similarly, transistor 722 is turned off (due to the inverted control signal SEB being supplied at the control terminal). As such, with SE set to a high value, the inverter of transistors 612 and 614 is disabled and transistors 704 and 708 are enabled. In this configuration, the signal received at input terminal 616 passes through pass transistor 704, is inverted by inverter 706, passes through pass transistor 708 and is output at output terminal 618. In other words, when SE is set to a high level the inverter of transistors 612 and 614 disabled and bypass path 702 is enabled. Because bypass path 702 includes inverter 706, bypass path 702 operates as an inverter to mimic the functionality of the inverter of transistors 612 and 614.

Given this structure, therefore it is possible to test the operation of the inverter of transistors 612 and 614. By supplying a particular input and toggling the control signal SE it is possible to selectively enable and disable the operation of the inverter and, correspondingly, transistors 704 and 708. Because the output of the inverter of transistors 612 and 614 should be the opposite of its input and because pass transistors 704 and 708 in combination of inverter 706 operate to output at output terminal 618 the inverted value of the input signal received from input terminal 616, when toggling the value of SE, the output at output terminal 618 should not change if the inverter is operating correctly (i.e., has not been damaged). Accordingly, using the circuit of SOC device 700 not only do pass transistors 704 and 708 provide protection against electrical discharge, but by toggling the value of control signal SE and monitoring the signal at output terminal 618 it is possible to detect that the inverter of transistors 612 and 614 is not operating correctly (e.g., as an inverter), which can be an indication of damage, which may be due to electrical discharge, for example, into the gate terminal of one or more of transistors 612 and 614.

In the event that damage is detected, the control signal may be set to a high value, in which case the inverter of transistors 612 and 614 is disabled and instead, pass transistors 704 and 708 and inverter 706 operate as an inverter. Although this may enable ongoing error-free operations of SOC device 700, as mentioned above, the configuration of pass transistors 708 and 708 may not enable operation of SOC device 700 at full clock-speeds. Accordingly, when bypassing the inverter the operational frequency of SOC device 700 may be reduced.

In a similar manner, SOC device 700 includes a second bypass path 752 configured to provide electrical protection to the level-shifter 631 made up of transistors 624, 628, 634, and 626. Bypass path 752 includes pass transistor 754. An input terminal of transistor 754 is connected to input terminal 616 and the control terminal of transistor 626 of level-shifter 631.

Pass transistor 754 is formed within isolated WELL 606 and has a clamp diode configuration in which a pair of diodes are connected between a ground terminal and the input and output terminals of pass transistor 754. Specifically, during device fabrication, pass transistor 754 operates to protect transistors 626 from electrical discharge from isolated WELL 604 and into input terminal 616 that may occur during fabrication steps involving plasma operations. This results because if the electrical discharge reaches a significant value (e.g., one that may cause damage to transistor 626), the clamp diode configuration of pass transistor 754 can cause that electrical discharge to be passed to ground.

If, however, that electrical discharge does cause damage to transistor 626, that damage can be detected using the present SOC device 700 configuration.

Specifically, SOC device 700 includes a pair of transistors 720, 722 that have been incorporated level-shifter 631. Transistor 760 is connected between transistor 628 and transistor 624. The control terminal of transistor 760 is connected to a high input signal from a power terminal to act as a balancing transistor for transistor 762. Transistor 762 is essentially required to cut-off transistor 626 in the case of failure and transistor 760 is used to balance the differential arm. Transistor 762 is connected between transistor 634 and transistor 626. The control terminal of transistor 762 receive an input signal SEB, which is the opposite of SE.

In this configuration, if the value of SE is high (indicating that pass transistor 754 is operational), and transistor 626 is cutoff from the level-shifter circuit by the transistor 762 which is OFF when SE is high. Transistor 758, which is connected to output 636 through transistor 755, which is controlled by the control input SE, will now be in enabled state because transistor 754 is ON and transistor 756 is OFF. In this configuration, transistor 758 will take over the functionality of transistor 626. The gate control of transistor 758 is also connected to electrical connection 617 through pass transistor 754. In normal operation, SE is low and SEB is high. So, transistor 758 is disabled in this level-shifter circuit and transistor 626 is enabled by default in level-shifter circuit. In the case of PID, transistor 754 tries to protect transistor 626 through its clamp diode. The alternate path 752 can be switched ON by driving SE to high to access the presence of any damage.

Given this structure, therefore it is possible to test the operation of level-shifter 631. By supplying a particular input and toggling the control signal SE it is possible to selectively enable and disable the operation of level-shifter 631 and, correspondingly, second bypass path 752. When toggling that control signal, if level-shifter 631 is operating correctly, the output at 642 should not change when the control signal is toggled. If the output does change, that indicates a malfunction, which could be due to damage within level-shifter 631 (e.g., at transistor 626), or, potentially, damage in transistor 614 or 612.

In the event that damage is detected, the control signal may be set to a high value, in which case level-shifter 631 is disabled and instead, second bypass path 752 is operational with transistors 754, 756, and 758 operating as a level shifter. Although this may enable ongoing error-free operations of SOC device 700, as mentioned above, the configuration of pass transistor 754 may not enable operation of SOC device 700 at full clock-speeds. Accordingly, when bypassing level-shifter 631, the operational frequency of SOC device 700 may be reduced.

Figure 8:
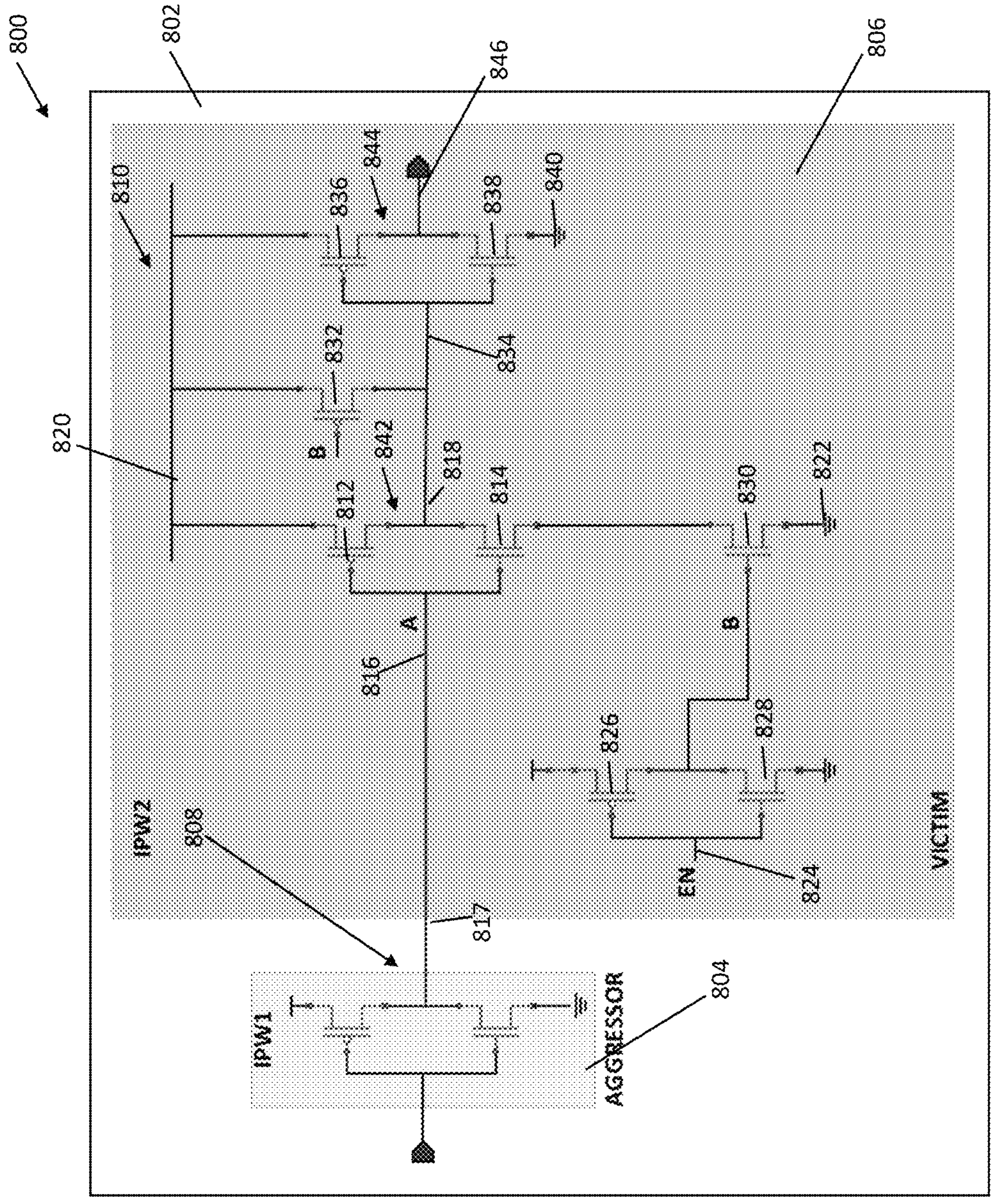
FIG. 8 is a simplified depiction of a conventional SOC device configured to implement an isolation cell device.

In another embodiment, the present disclosure provides a circuit for detection and mitigation of PID-induced failure in an isolation cell device. To illustrate, FIG. 8 is a simplified depiction of a conventional SOC device 800 configured to implement an isolation cell device. SOC device 800 includes a substrate 802 including isolated WELL 804 and isolated WELL 806. Device 808 is formed within isolated WELL 804. Device 808 includes an electronic circuit (e.g., a transistor structure in combination with an antenna or antenna-like structure) that is susceptible to charge build-up during a plasma-based manufacturing process of SOC device 800.

Isolation cell 810 is formed within isolated WELL 806. Isolation cell 810 includes a transistor pair including transistors 812 and 814 connected between a power supply terminal 820 and ground terminal 822. Transistors 812 and 814 are connected in an inverter configuration with an input terminal 816 and an output terminal 818. Input terminal 816 is connected to device 808 via electrical connection 817 and to the gate terminals of transistors 812 and 814. Input terminal 816 receives an input signal A that represent the primary input of isolation cell 810.

Output terminal 818 is connected to input terminal 834 of the inverter made of up of transistors 836 and 838, which are connected in series between power supply terminal 820 and ground terminal 840.

In this configuration, when isolation cell 810 is operational (discussed below), the input signal A is received at 816 is inverted by inverter 842, inverted again by inverter 844 and output at output terminal 846.

To control the operation of isolation cell 810, isolation cell 810 includes a second input terminal 824 configured to receive a second signal EN that determines whether the isolation cell 810 is enabled. That input signal is inverted by the inverter made up of transistors 826 and 828 to generate an output signal B. If B has a high level, isolation cell 810 is enabled, and if B has a low value, isolation cell 810 is disabled. The control signal B is supplied to the gate control terminal of transistor 830, which is connected between transistor 814 and ground terminal 822. The same supply signal B is supplied at the gate or control terminal of transistor 832, which is connected between power supply terminal 820 and output terminal 818.

When B has a high value (indicating isolation cell 810 is enabled), transistor 830 is enabled allowing for normal operations of the inverter made up by transistors 812 and 814. Additionally, transistor 832 is disabled. However, when B has a low value (indicating that isolation cell 810 is disabled), transistor 830 is non-conductive, meaning that the inverter of transistors 812 and 814 is non-operative). Additionally, when B is low, transistor 832 is conductive so that the value at output terminal 818 is pulled high to the voltage at 820. That high value is inverted by inverter 844, so in this configured (i.e., with isolation cell 810 disabled), the output of isolation cell 810 will always be a low value.

In this configuration, during fabrication of SOC device 800 and, specifically, during fabrication processes that involve plasma-based operations (e.g., plasma etching and/or plasma deposition) there is a risk of electrical charge build-up within isolated WELL 804 and device 808. That electrical charge may be discharged through connection 817 into isolation cell 810, resulting in potential damage to isolation cell 810. In a typical case, this electrical discharge may be likely to damage the gate oxide of the gate terminal of transistor 814, which we be subjected to a majority of that electrical discharge.

Figure 9:
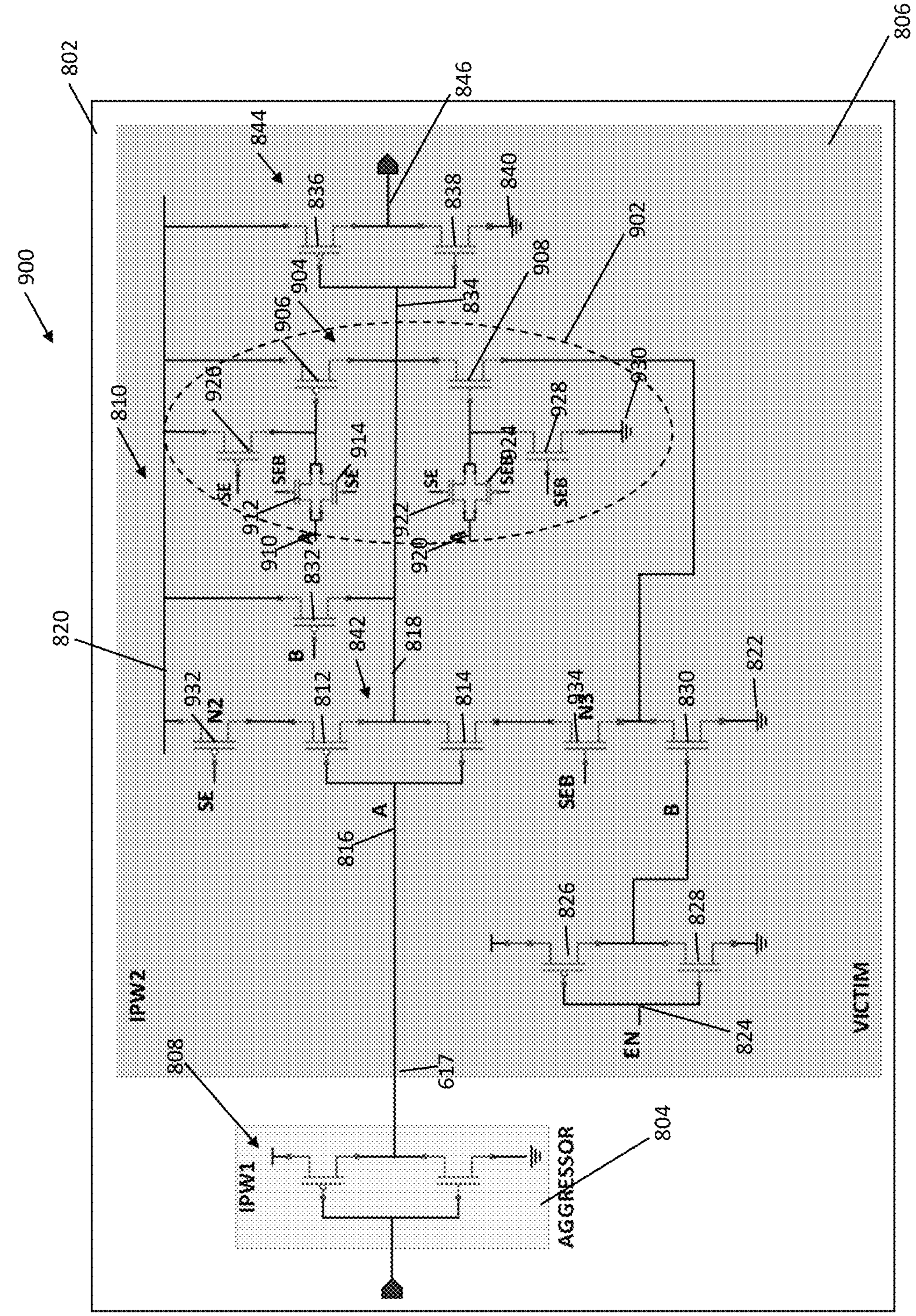
FIG. 9 depicts the SOC device of FIG. 8 modified by the incorporation of additional circuit elements to form an SOC device configured to provide electrical discharge protection.

To remedy these problems, FIG. 9 depicts a modified isolation cell circuit configuration in which additional circuit components are incorporated to protect the isolation cell circuit from damage due to electrical discharge occurring during device fabrication. FIG. 9 depicts the SOC device 800 of FIG. 8 modified by the incorporation of additional circuit elements to form SOC device 900 configured to provide electrical discharge protection. To the extent components in SOC device 900 are the same as those depicted in FIG. 8 (i.e., configured in the same manner and providing the same functionality), component element numbers are unchanged and the pertinent description of such components above is applicable.

As depicted, SOC device 900 includes a bypass path 902 or circuit including components that, as described below, can operate as a back-up inverter in the event of damage to inverter 842 and, specifically, transistors 814 of inverter 842.

Specifically, bypass path 902 includes an inverter 904 made of transistors 906 and 908 that are connected between power supply terminal 820 and a first terminal of transistor 830, as illustrated.

Input terminal 910 is configured to receive the input signal A. Input terminal 910 is connected to first terminals of transistors 912 and 914. Second terminals of transistors 912 and 914 are connected to the gate or control terminal of transistor 906. The control terminal of transistor 912 receives an input signal SEB, which is the inverse of the control signal SE, discussed below. The control terminal of transistor 912 is an inverting input so when SEB is high, transistor 912 is non-conductive. However, when SEB is low, transistor 912 is conductive. The control terminal of transistor 914 receives an input signal SE. When SE is high, transistor 914 is conductive. When SE is low, transistor 914 is conductive.

In this configuration, when SE is high, the input signal A is passed through transistors 912 and 914 to the control terminal of transistor 906.

Input terminal 920 is configured to receive the input signal A. Input terminal 920 is connected to first terminals of transistors 922 and 924. Second terminals of transistors 922 and 924 are connected to the gate or control terminal of transistor 908. The control terminal of transistor 924 receives an input signal SEB, which is the inverse of the control signal SE. The control terminal of transistor 924 is an inverting input so when SEB is high, transistor 924 is non-conductive. However, when SEB is low, transistor 924 is conductive. The control terminal of transistor 922 receives an input signal SE. When SE is high, transistor 922 is conductive. When SE is low, transistor 922 is conductive.

In this configuration, when SE is high, the input signal A is passed through transistors 922 and 924 to the control terminal of transistor 908.

Transistor 926 is connected between power supply terminal 820 and the control terminal of transistor 906. The control signal SE is supplied to the control terminal of transistor 926, which is an inverting terminal. As such, when SE is high, transistor 926 is non-conductive, enabling operation of bypass path 902. However, when SE is low (e.g., during normal operations of SOC device 900 in which bypass path 902 is non-operative), transistor 926 is conductive, which connects the control terminal of transistor 906 to power supply terminal 820, which, due to the transistor's inverting control terminal makes transistor 906 non-conductive, effectively disabling bypass path 902.

Similarly, transistor 928 is connected between the control terminal of transistor 906 and ground node 930. The control signal SEB is supplied to the control terminal of transistor 928. As such, when SEB is low, transistor 928 is non-conductive, enabling operation of bypass path 902. However, when SEB is high (e.g., during normal operations of SOC device 900 in which bypass path 902 is non-operative), transistor 928 is conductive, which connects the control terminal of transistor 908 to ground node 930, which makes transistor 908 non-conductive, effectively disabling bypass path 902.

Transistor 932 is connected between a first terminal of transistor 812 and power supply terminal 820. The control terminal of transistor 932 receives the SE control input signal. The control terminal of transistor 932 is an inverting terminal such that when SE is high, transistor 932 is non-conductive, which disables the operation of inverter 842. Conversely, when SE is low, transistor 932 is conductive enabling normal operations of inverter 842.

Transistor 934 is connected between transistor 814 and transistor 830. The control terminal of transistor 934 receives the SEB control input signal. When SE is low, transistor 934 is non-conductive, which disables the operation of inverter 842. Conversely, when SEB is high, transistor 934 is conductive enabling normal operations of inverter 842.

In this configuration, if the value of SE is low (indicating that inverter 842 is operational), inverter 904 of bypass path 902 is disabled and isolation cell 810 can operate normally. However, if the value of SE is high, inverter 842 is effectively disabled, and bypass path 902 is enabled such that inverter 904 supplies the inverted version of input signal A to input terminal 834 of inverter 844.

Given this structure, therefore it is possible to test the operation of inverter 842 to detect potential damage that may have resulted during plasma processing, as discussed above. As such, by supplying particular input signals A and EN and toggling the control signal SE it is possible to selectively enable and disable the operation of inverter 842 and, correspondingly, transistors 812 and 814. For a given combination of input values A and EN, when toggling the value of SE, the output at output terminal 846 should not change if inverter 842 is operating correctly (i.e., has not been damaged). Accordingly, using the circuit of SOC device 900, by toggling the value of control signal SE and monitoring the signal at output terminal 846 it is possible to detect that inverter 842 is not operating correctly (e.g., as an inverter), which can be an indication of damage, which may be due to electrical discharge, for example, into the gate terminal of one or more of transistors 812 and 814.

In the event that damage is detected, the control signal SE may be set to a high value, in which case inverter 842 is disabled and instead, bypass path 902 operates as an inverter to enable ongoing error-free operations of SOC device 900.

Figure 10:
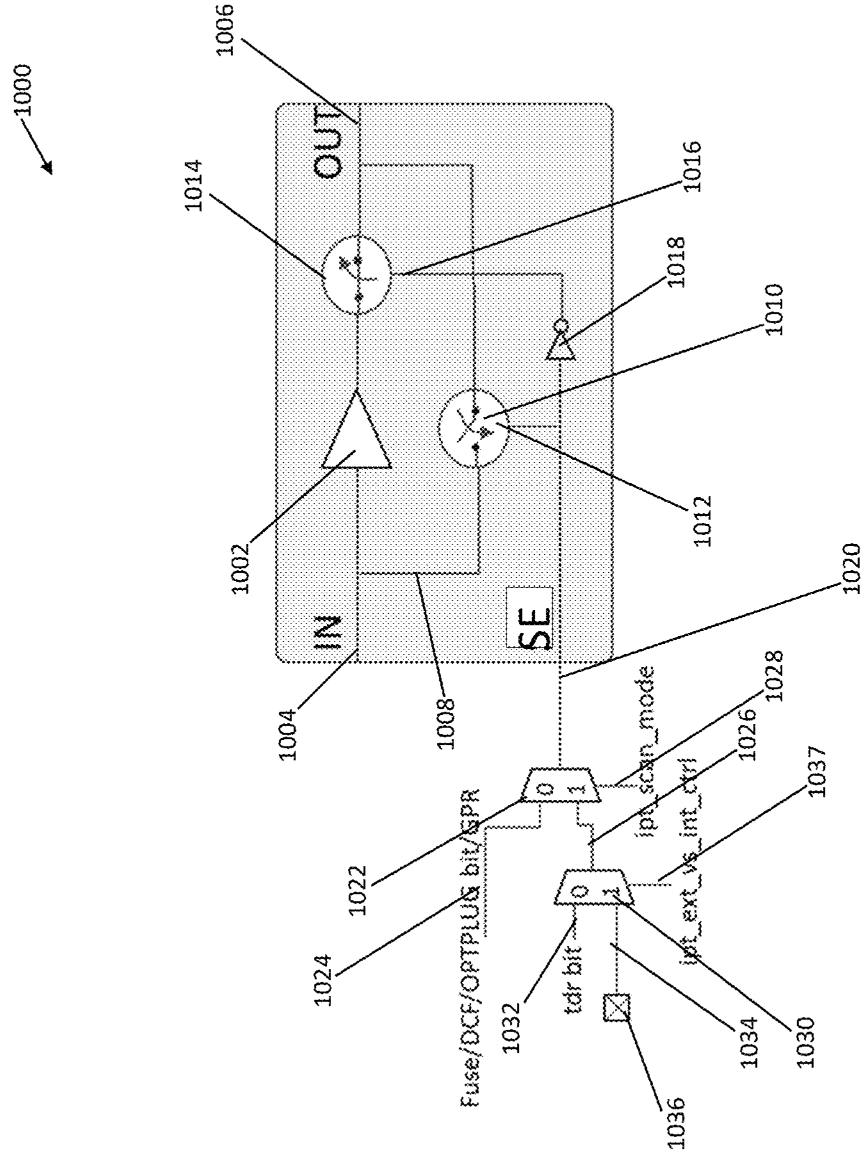
FIG. 10 is a block diagram depicting functional components of a device configured in accordance with the present disclosure.

FIG. 10 is a block diagram depicting functional components of a device 1000 configured in accordance with the present disclosure. Device 1000 includes an electronic device 1002 (e.g., a buffer, inverter, level shifter, or isolation cell) that includes an input terminal 1004 and an output terminal 1006. Device 1000 includes a bypass path 1008 (e.g., bypass path 302, bypass path 502, bypass path 702, second bypass path 752, bypass path 902) that is connected between input terminal 1004 and output terminal 1006. Bypass path 1008 includes switch 1010 (e.g., pass transistor 304, pass transistors 504, pass transistor 704, pass transistor 754) that is controlled by a control signal received at control input 1012 of switch 1010. When the control signal has a first value, switch 1010 is open, which disables bypass path 1008 enabling normal operation of electronic device 1002. However, when the control signal has a second value, switch 1010 is closed, enabling bypass path 1008 and effectively bypassing electronic device 1002.

Device 1000 includes switch 1014 (e.g., transistor 320 and transistor 322, transistor 520 and transistor 522, transistor 760 and transistor 762, bypass path 902) that is controlled by a control signal received at control input 1016 of switch 1014. The control signal received by control input 1016 of switch 1014 is inverted by inverter 1018 so that when the control signal has the first value, switch 1010 is closed, which enables the output of electronic device 1002 to be passed to output terminal 1006. However, when the control signal has the second value, control input 1016 is open, disconnecting electronic device 1002 from output terminal 1006 effectively disabling electronic device 1002.

The control signal is received at control signal input 1020 as an output from demultiplexer 1022. Demultiplexer 1022 has a first input 1024 configured to receive an input based on the device configuration. A second input 1026 of demultiplexer 1022 is configured to receive an output from demultiplexer 1030. Demultiplexer 1022 receives a control input at control terminal 1028. When the input at control terminal 1028 causes the input signal at first input 1024 to be output by demultiplexer 1022, the value of the control signal can be determined by the Fuse Bit or NVM bit. However, when the input at control terminal 1028 causes the input signal at second input 1026 to be output by demultiplexer 1022, the value of the control signal can be determined by the output signal of demultiplexer 1030.

Demultiplexer 1030 includes a first input 1032 configured to receive an input from a device test data register. Demultiplexer 1030 includes a second input 1034 configured to receive an input from a device pin 1036 or other electrical terminal accessible to external devices. The output of second input 1034 is determined by a control signal received at control input 1037, which selects whether the output of second input 1034 is the value stored in the test data register or the value at the device pin 1036.

As such, by selecting appropriate input signals to demultiplexer 1022 and demultiplexer 1030, device 1000 may be placed in a normal mode of operation (e.g., where the output of control signal input 1020 is the first value of the control signal). In that case, bypass path 1008 is disabled.

However, by providing different inputs to demultiplexer 1022 and demultiplexer 1030, the control signal can be set to the second value (e.g., via one or more input of the Fuse bit, the test data register, or the external control pin) enabling bypass path 1008 to be enabled and, at the same time, electronic device 1002 to be disabled.

Accordingly, demultiplexer 1022 and demultiplexer 1030 provide various mechanisms by which bypass path 1008 can be selectively enabled to allow for test patterns to be executed on electronic device 1002 to detect potential malfunctions, such as those resulting from plasma induced discharge.

Figure 11:
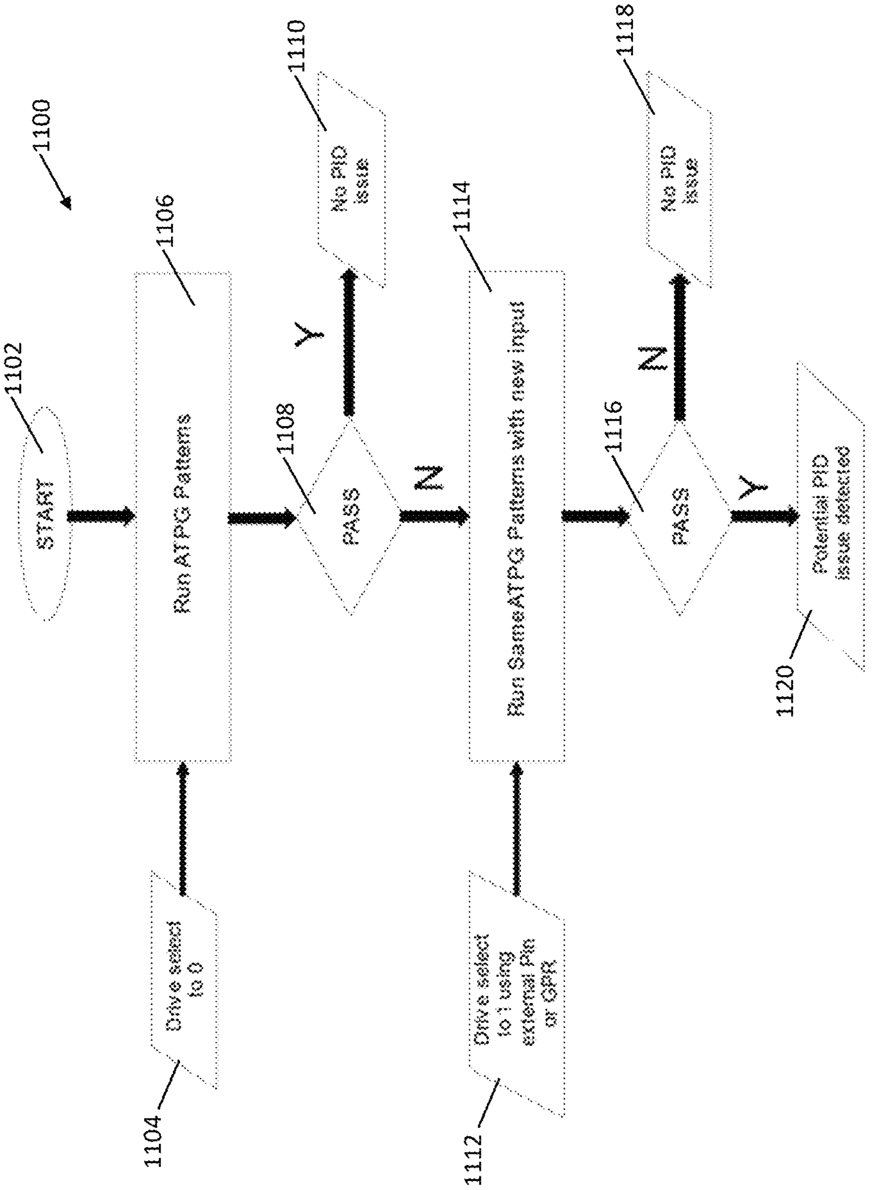
FIG. 11 is a flow chart depicting a method of testing an SOC device incorporating a bypass circuit configured in accordance with the present disclosure to detect potential device damage.

To illustrate, FIG. 11 is a flow chart depicting a method 1100 of testing an SOC device incorporating a bypass circuit configured in accordance with the present disclosure to detect potential device damage. Method 1100 may be implemented by a suitably configured testing device configured to provide signal inputs and control signals (e.g., the signals SE and/or SEB) to various input terminals of the SOC device being tested. Method 1100 begins at block 1102. To initiate testing, at block 1104 the select control signal SE is driven to a low value of 0 (e.g., to disable the various bypass circuits and enable normal operations of the device). At block 1106 a series of automatic test pattern generator (ATPG) test patterns are run to determine whether the device is operating correctly. If, at pass block 1108, it is determined that the device passes the ATPG test patterns with SE set to a high value, method 1100 ends at block 1110 with an indication that there is no PID issue and that the device is not malfunctioning.

If, however, at block 1108 it is determined that the device did not pass the ATPG test pattern with SE set to a low value, at block 1112 the control input SE is set to a high value of 1 and the same ATPG test patterns are run at block 1114.

If at block 1116 it is determined that the device passed the ATPG test patterns, method 1100 ends at block 1118 with an indication that there are no PID issues. In that case, the device may operate normally, however, as discussed above, because the device is operating nominally only due to the use of the various bypass paths or circuits described herein (as enabled by the high SE control signal input), the device may be configured to operate at a reduced operational frequency. This outcome is indicative of detection of a potential PID issue with the device.

If, however, at block 1116 it is determined that the device again failed the ATPG test patterns, the method ends at block 1120 with an indication that the device has a potential non-PID related issue that requires diagnosis.

In some aspects, the techniques described herein relate to a device, including: a substrate that includes a first isolated well and a second isolated well; a first electronic device formed within the first isolated well, the first electronic device including a first electronic circuit electrically connected to an antenna; and a second electronic device formed within the second isolated well, the second electronic device including: an input terminal that is electrically connected to the first electronic device, a second electronic circuit, the second electronic circuit including a first transistor, wherein a control terminal of the first transistor is electrically connected to the input terminal, a third electronic circuit including a clamp diode transistor, wherein the clamp diode is electrically connected to the input terminal, wherein the clamp diode transistor is configured to limit a voltage that may be applied to the control terminal of the first transistor and wherein the clamp diode transistor is configured to receive a control input signal, wherein when the control input signal has a first value the clamp diode transistor is conductive, and an output terminal electrically connected to the second electronic circuit and the third electronic circuit.

In some aspects, the techniques described herein relate to a system, including: a device, including: a substrate that includes an isolated well, a electronic device within the isolated well, the electronic device including: an input terminal, a first electronic circuit including a first transistor, wherein a control terminal of the first transistor is electrically connected to the input terminal, a second electronic circuit including a clamp diode transistor, wherein the clamp diode is electrically connected to the input terminal, wherein the clamp diode transistor is configured to receive a control input signal and when the control input signal has a first value the clamp diode transistor is conductive, and an output terminal electrically connected to the first electronic circuit and the second electronic circuit; and a testing device configured to perform steps of: supplying a first input signal to the input terminal, switching the control input signal between the first value and a second value, and monitoring an output of the electronic device at the output terminal to detect a malfunction in the electronic device.

In some aspects, the techniques described herein relate to a method, including: supplying a first input signal to an input terminal of an electronic device, wherein the electronic device includes: a substrate that includes an isolated well, a electronic device within the isolated well, the electronic device including: the input terminal, a first electronic circuit including a first transistor, wherein a control terminal of the first transistor is electrically connected to the input terminal, a second electronic circuit including a clamp diode transistor, wherein the clamp diode is electrically connected to the input terminal, wherein the clamp diode transistor is configured to receive a control input signal and when the control input signal has a first value the clamp diode transistor is conductive, and an output terminal electrically connected to the first electronic circuit and the second electronic circuit; switching the control input signal between the first value and a second value; and monitoring an output of the electronic device at the output terminal to detect a malfunction in the electronic device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms “front,” “back,” “top,” “bottom,” “over,” “under” and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

As used herein the terms “substantial” and “substantially” mean sufficient to accomplish the stated purpose in a practical manner and that minor imperfections, if any, are not significant for the stated purpose. Also as used herein, the terms “approximately” and “about” mean a value close to or within an acceptable range of an indicated value, amount, or quality, which also includes the exact indicated value itself.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms “a” or “an,” as used herein, are defined as one or more than one. Also, the use of introductory phrases such as “at least one” and “one or more” in the claims should not be construed to imply that the introduction of another claim element by the indefinite articles “a” or "an" limits any particular claim containing such introduced claim element to inventions containing only one such element, even when the same claim includes the introductory phrases "one or more" or "at least one" and indefinite articles such as "a" or "an." The same holds true for the use of definite articles.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

For the sake of brevity, conventional semiconductor fabrication techniques may not be described in detail herein. In addition, certain terminology may also be used herein for reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device, comprising:
- a substrate that includes a first isolated well and a second isolated well;
- a first electronic device formed within the first isolated well, the first electronic device including a first electronic circuit electrically connected to an antenna; and
- a second electronic device formed within the second isolated well, the second electronic device including:
  - an input terminal that is electrically connected to the first electronic device,
  - a second electronic circuit, the second electronic circuit including a first transistor, wherein a control terminal of the first transistor is electrically connected to the input terminal,
  - a third electronic circuit including a clamp diode transistor, wherein the clamp diode transistor is electrically connected to the input terminal, wherein the clamp diode transistor is configured to limit a voltage that may be applied to the control terminal of the first transistor and wherein the clamp diode transistor is configured to receive a control input signal, wherein when the control input signal has a first value the clamp diode transistor is conductive, and
  - an output terminal electrically connected to the second electronic circuit and the third electronic circuit.

2. The device of claim 1, wherein the second electronic circuit is configured to receive the control input signal and wherein, when the control input signal has the first value, the second electronic circuit is disabled.

3. The device of claim 2, wherein the second electronic circuit includes a second transistor and wherein a control terminal of the second transistor is configured to receive the control input signal.

4. The device of claim 2, further comprising a testing device configured to perform steps of:
- supplying a first input signal to the input terminal;
- switching the control input signal between the first value and a second value, and
- monitoring an output of the second electronic device at the output terminal to detect a malfunction in the second electronic device.

5. The device of claim 4, wherein the testing device, to detect the malfunction in the second electronic device, is configured to perform steps of:
- when the control input signal has the first value, detect a first output value of an output signal of the second electronic device at the output terminal;
- when the control input signal has the second value, detect a second output value of an output signal of the second electronic device at the output terminal; and
- determine that the first output value is not equal to the second output value.

6. The device of claim 4, wherein the testing device, to detect the malfunction in the second electronic device, is configured to perform steps of:
- setting the control input signal to the first value;
- determining a first result of a set of automatic test pattern generator (ATPG) test patterns run on the second electronic device;
- setting the control input signal to the second value;
- determining a second result of the set of ATPG test patterns run on the second electronic device; and
- detecting the malfunction based on at least one of the first result and the second result.

7. The device of claim 4, wherein the testing device, after detecting the malfunction, is configured to generate an output indicative of a plasma induced damage to the second electronic device.

8. The device of claim 1, wherein the second electronic circuit includes an input buffer and wherein a first terminal of the clamp diode transistor is connected to the input terminal, a second terminal of the clamp diode transistor is connected to the output terminal, and a control terminal of the clamp diode transistor is configured to receive the control input signal.

9. The device of claim 1, wherein the first electronic device includes a wireless signal receiver and the second electronic device includes a signal driver.

10. A system, comprising:
- a device, including:
  - a substrate that includes an isolated well, a electronic device within the isolated well, the electronic device including:

an input terminal, a first electronic circuit including a first transistor, wherein a control terminal of the first transistor is electrically connected to the input terminal, a second electronic circuit including a clamp diode transistor, wherein the clamp diode transistor is electrically connected to the input terminal, wherein the clamp diode transistor is configured to receive a control input signal and when the control input signal has a first value the clamp diode transistor is conductive, and an output terminal electrically connected to the first electronic circuit and the second electronic circuit; and a testing device configured to perform steps of:

supplying a first input signal to the input terminal, switching the control input signal between the first value and a second value, and monitoring an output of the electronic device at the output terminal to detect a malfunction in the electronic device.

11. The system of claim 10, wherein the first electronic circuit is configured to receive the control input signal and wherein, when the control input signal has the first value, the first electronic circuit is disabled.

12. The system of claim 10, wherein the testing device, to detect the malfunction in the second electronic device, is configured to perform steps of:

when the control input signal has the first value, detect a first output value of an output signal of the electronic device at the output terminal;

when the control input signal has the second value, detect a second output value of an output signal of the electronic device at the output terminal; and determine that the first output value is not equal to the second output value.

13. The system of claim 10, wherein the testing device, to detect the malfunction in the second electronic device, is configured to perform steps of:

setting the control input signal to the first value;

determining a first result of a set of ATPG test patterns run on the second electronic device;

setting the control input signal to the second value;

determining a second result of the set of ATPG test patterns run on the second electronic device; and detecting the malfunction based on at least one of the first result and the second result.

14. The system of claim 13, wherein the testing device, after detecting the malfunction, is configured to generate an output indicative of a plasma induced damage to the second electronic device.

15. The system of claim 10, wherein the second electronic circuit includes an input buffer and wherein a first terminal of the clamp diode transistor is connected to the input terminal, a second terminal of the clamp diode transistor is connected to the output terminal, and a control terminal of the clamp diode transistor is configured to receive the control input signal.

16. The system of claim 10, wherein the device includes a wireless signal receiver and the electronic device includes a signal driver.

17. A method, comprising:

supplying a first input signal to an input terminal of an electronic device, wherein the electronic device includes:

a substrate that includes an isolated well, a electronic device within the isolated well, the electronic device including:

the input terminal, a first electronic circuit including a first transistor, wherein a control terminal of the first transistor is electrically connected to the input terminal, a second electronic circuit including a clamp diode transistor, wherein the clamp diode transistor is electrically connected to the input terminal, wherein the clamp diode transistor is configured to receive a control input signal and when the control input signal has a first value the clamp diode transistor is conductive, and an output terminal electrically connected to the first electronic circuit and the second electronic circuit;

switching the control input signal between the first value and a second value; and monitoring an output of the electronic device at the output terminal to detect a malfunction in the electronic device.

18. The method of claim 17, further comprising detecting the malfunction in the second electronic device by performing steps including:

when the control input signal has the first value, detecting a first output value of an output signal of the electronic device at the output terminal;

when the control input signal has the second value, detecting a second output value of an output signal of the electronic device at the output terminal; and determining that the first output value is not equal to the second output value.

19. The method of claim 17, further comprising detecting the malfunction in the second electronic device by performing steps including:

setting the control input signal to the first value;

determining a first result of a set of ATPG test patterns run on the second electronic device;

setting the control input signal to the second value;

determining a second result of the set of ATPG test patterns run on the second electronic device; and detecting the malfunction based on at least one of the first result and the second result.

20. The method of claim 19, further comprising, after detecting the malfunction, generating an output indicative of a plasma induced damage to the second electronic device.

* * * * *